United States Patent [19]

Kidder et al.

[11] Patent Number: 5,046,806
[45] Date of Patent: Sep. 10, 1991

[54] SINGLE FIBRE CONTROL SWITCHES

[75] Inventors: John S. Kidder; Derek Montgomery, both of Vancouver, Canada

[73] Assignee: CST Coldswitch Holdings Inc., Vancouver, Canada

[21] Appl. No.: 482,913

[22] Filed: Feb. 22, 1990

[51] Int. Cl.$^5$ .......................... G02B 6/26; G02B 6/42
[52] U.S. Cl. ...................................................... 385/16
[58] Field of Search ..................................... 350/96.15

[56] References Cited

U.S. PATENT DOCUMENTS

| 4,650,277 | 3/1987 | Husher et al. | 350/96.15 |
| 4,863,230 | 9/1989 | Webb | 350/96.15 |
| 4,892,373 | 1/1990 | Sie | 350/96.15 |
| 4,919,512 | 4/1990 | Flaherty | 350/96.15 |

Primary Examiner—William L. Sikes
Assistant Examiner—Robert E. Wise
Attorney, Agent, or Firm—Shlesinger Arkwright Garvey

[57] ABSTRACT

A fibre optic switch which includes an actuator reversibly movable between at least two switch positions, an actuator position detector and a single optical fibre path connected between the actuator and the actuator position detector. A beam splitter is provided to couple light from a light source into the fibre so as to travel towards the actuator. A filter is selectably insertable into the path of light emanating from an end of the fibre at the actuator and a retro-reflector reflects the filtered light back to the fibre. The reflected light is directed by the beam splitter towards the actuator position detector.

30 Claims, 6 Drawing Sheets

SINGLE FIBRE CONTROL SWITCHES

RELATED APPLICATIONS

The present application relates to application Ser. No. 07/403,373 filed by the inventors herein on Sep. 6, 1989.

FIELD OF THE INVENTION

The present invention relates to a fiber optic switch capable of acting as a dual or multi-level switch or as a continuous level switch.

BACKGROUND OF THE INVENTION

Fiber optic switches are known for the control of such things as a wall receptacle and an electrical circuit. U.S. Pat. No. 4,704,656 issued Nov. 3, 1987 to Neiger discloses an optical fiber interconnection between a switch and a load such as an electrical wall receptacle. Light at a load end is transmitted along a single fiber to a switch consisting of a pivotal mirror. In a reflecting position the mirror reflects light back down the fiber and onto a photoresistor to cause the actuation of a relay. A major problem with the Neiger arrangement is the criticality of alignment of the mirror used to reflect the light. Utilizing the mirror reflector whose alignment is critical as a pivotal switch creates a severe potential misalignment source. Also, the mirror restricts the invention to "single throw" switch configuration precluding its use for colour multiplexing which involves the simultaneous transmittal of data using selected colours or wavelengths.

A simple switch which switches the light travelling along the fiber itself is disclosed in Applicant's application filed in the United States on Sep. 6, 1989. The latter switch utilizes one fiber for input and another for the output when switching from ON to OFF or, when switching between two different outputs, two separate output fibers. Clearly, in any application a reduction in the number of fibers will produce a corresponding increase in reliability and reduction in system cost. Consequently, any further simplification of the basic switch invention described in the above-referenced U.S. patent application which results in a reduction particularly in the number of fibers would likely result in a significant increase in reliability.

Accordingly, it is an object of the invention to provide an improved fiber optic switch. It is a further object of the invention to provide a fiber optic switch which utilizes a single optical fiber path means between the switch and the element detecting the switch position. It is yet a further object to provide a fiber optic switch which is substantially less susceptible to misalignment than previously known single fiber systems. It is yet a further object of the invention to have an optical geometry that is simple to manufacture and insensitive to reasonable manufacturing tolerances. Yet a further object is to provide means for combining a plurality of switches and switch position detectors using a single fiber.

SUMMARY OF THE INVENTION

According to the invention there is provided a fiber optic switch which includes an actuator reversibly movable between at least two switch positions, an actuator position detector, an optical fiber path means connected between the actuator and the actuator position detector, means for coupling light from a light source into the optical fiber path means so as to travel towards the actuator, and a filter coupled to the actuator selectably insertable into a path of light emanating from an end of the optical fiber path means at the actuator A retro-reflector is positioned at the actuator to reflect light from the fiber 180 degrees so as to travel back along the optical fiber path means towards the actuator position detector. Means for directing reflected light returning down the optical fiber path means from the actuator toward the actuator position detector are also provided.

A collimating lens may be positioned at an end of the fiber before the retro-reflector to ensure that reflected light is focused onto the fiber, the combination of collimating lens and retro-reflector making the focusing insensitive to the lateral alignment of the fiber and tilt of the retro-reflector.

The various actuator filters used may include a simple opaque shutter which serves as an optical interrupter or a plurality of filters (i.e. cyan, magenta, yellow) and spectrally complementary actuator position detector filters (i.e. red, green, blue) such that only one filter can be inserted at one time into the light path to signify actuation of one of the controls.

The light coupling means and directing means may be a beam-splitter positioned at the point of coupling light from a light source into the optical fiber path means which serves to separate the source light from the light returning from the retroreflector. A fiber-optic directional coupler such as a coupler using the butt coupling of fiber may also be used.

The actuator position detector may include a filter positioned in the path of light emanating from a detector end of the optical fiber path means with a selected light response with respect to that of the actuator filter. The selected light response of the filter in the actuator position detector may be either substantially the same as that of the actuator filter or complementary. For example, when multiplexing several signals it may be required that for multiple, concurrent switch actuations, the light transmitted to the actuator position detectors will simply have removed that colour component corresponding to the actuated switches. The use of filter colours which allow only the removed colour component permits several different colour components to be used at the same time. In such a system such filters are complementary. Utilizing a single optical fiber path means with duplex transmission of light both to and from the actuator reduces the need for at least one extra optical fiber for each switch in a system. In a system having hundreds of different switches such as an airplane cockpit, this reduction translates into a considerable increase in reliability as well as cost saving.

Two filters of different colours may be coupled to the actuator so that one is positioned to filter light from an actuator end of the optical fiber path means when the actuator is in a first switch position and another to filter the light when the actuator is in a second position.

Two detector input fibers may be coupled to an end of the optical fiber path means proximate the detector. Means may be provided for directing light from a detector end of the optical fiber path means into the two detector input fibers. Two filters of selected colour relative to corresponding actuator filters each filter light from a respective end of said detector fibers.

A pair of photodetectors may be positioned near the filters so as to detect the intensity of light transmitted therethrough. The use of filters at the detector corresponding in colour to the colour of the actuator filters allows a one-to-one correspondence between actuator switch position and light detection at the corresponding photodetector. Use of filters with a one-to-one correspondence to filters in the actuator position detector allows the flexibility of simply changing filter colours in order to change detector-actuator position assignments.

The actuator may include a lever, slide, or a rotating assembly. Included in the lever assembly may be individual levers with associated filters mounted thereon or rocker switches pivotal about a pin. A slide assembly may includes a plunger slidable within a receptacle in a pushbutton form or a structure slidable parallel to the surface of a casing.

There may be attached to the slide a flexible filter carrier which carries a filter on at least two transparent locations on the carrier. As the actuator moves from one switch position to another the slide carrier slides through the optical path of light emanating from the fiber from a position in which the filter is in the path to one in which another of the transparent positions of the carrier is in the path.

A rotating assembly may include a wheel with one or more filters mounted circumferentially therearound or any other kind of rotary switch.

In another aspect of the invention there may be provided a fiber optic switch having an actuator reversibly movable among a plurality of switch positions, an actuator position detector, an optical fiber connected between the actuator and the actuator position detector, and means for coupling light from a light source into the fiber so as to travel towards the actuator. A plurality of filters are coupled to the actuator and are selectably insertable into a path of light emanating from an end of the fiber at the actuator. A retro-reflector is positioned at the actuator to reflect light from the fiber 180 degrees so as to travel back along the same fiber towards the actuator position detector and means for directing reflected light returning down the optical fiber path means from the actuator toward the actuator position detector are also provided.

In yet another aspect of the invention there may be provided a fiber optic switch having a continuously variable reversibly movable actuator, an actuator position detector, an optical fiber connected between the actuator and the actuator position detector, and means for coupling light from a light source into the fiber so as to travel towards the actuator. A continuously variable neutral density filter is coupled to the actuator and is continuously variably insertable in the path of light emanating from an end of the fiber so as to continuously variably attenuate light transmitted therethrough. A retroreflector is positioned after the actuator to reflect light from the fiber 180 degrees so as to travel back along the same fiber towards the actuator position detector. Means for directing reflected light returning down the optical fiber path means from the actuator toward the actuator position detector are also provided. A light detector is provided at an end of said fiber to detect reflected light and provide a corresponding analog signal.

BRIEF DESCRIPTION OF THE DRAWINGS

The novel features believed characteristic of the invention are set forth in the appended claims. The invention itself, however, as well as other features and advantages thereof, will be best understood by reference to the description which follows, read in conjunction with the accompanying drawings, wherein:

DETAILED DESCRIPTION WITH REFERENCE TO THE DRAWINGS

Figure 1:
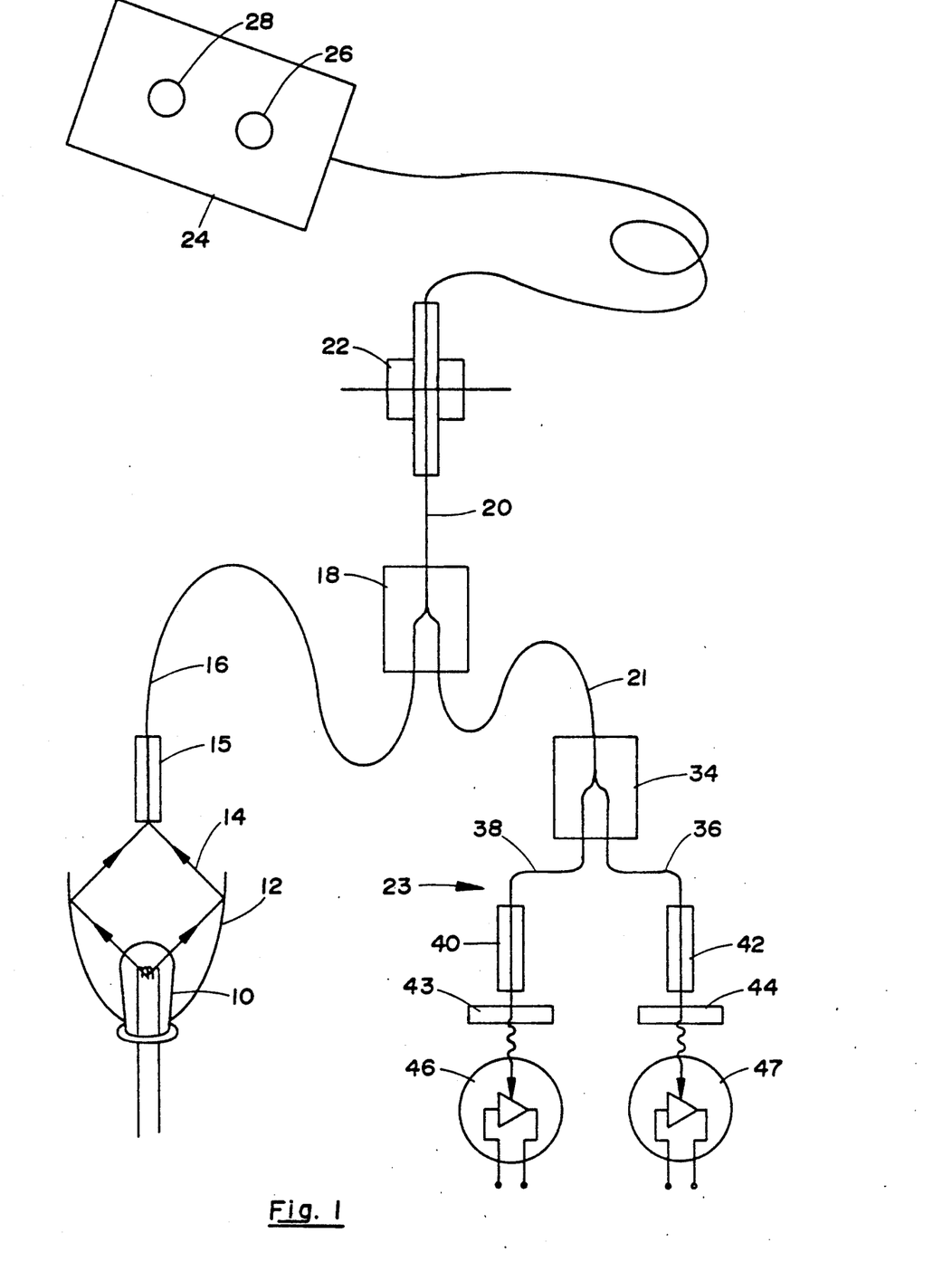
FIG. 1 is a schematic drawing showing a single fiber between the actuator and the actuator position sensors

Referring to FIG. 1 there is shown an arrangement for a single fiber switch system consisting of a light source 10 having a reflecting envelope 12 for reflecting light 14 into a ferrule 15 of an optical light source fiber 16. Fiber 16 is coupled to a single actuator and detector fibers 20 and 21, respectively, by means of a directional coupler 18 which directs most of the source light towards an actuator 24. Directional coupler 18 is ordinarily a conventional beam splitter (see mirror 94 in FIG. 4). However, butt coupling of fibers or a graded index rod lens could also be used. Actuator 24 includes two actuator buttons 26 and 28 for inserting into the light path two corresponding associated filter elements (see FIG. 2). Actuator fiber 20 also connects to a directional coupler 34 which directs light through detector fiber 21 and out through ferrules 40 and 42. Light passes out of ferrules 40 and 42 through filters 43 and 44, respectively, and into photo-detectors or photodiodes 46 and 47, respectively. Thus, a single fibers 20 and 21 connect between the actuator 24 and the actuator position sensing elements 46 and 47. Light filtered by selecting an appropriate one of switch filter actuator buttons 26 and 28 is preferentially transmitted through an associated one of filters 43 and 44.

Clearly, more than two filter sets can be employed together with a corresponding increase in the number of actuator buttons.

In a typical application the fibers 20 and 21 from a number of different single fiber switches would be carried in a harness from the actuators to the element detecting actuator position. A bundle of light source fibers 16 would connect to respective ones of fibers 20 and 21. Thus, the need to have a separate fiber to the actuator and two or more fibers from the actuator to the element detecting actuator position is avoided and replaced by a unit having only a short light source fiber 16 and a single set of fibers 20 and 21.

Figure 2:
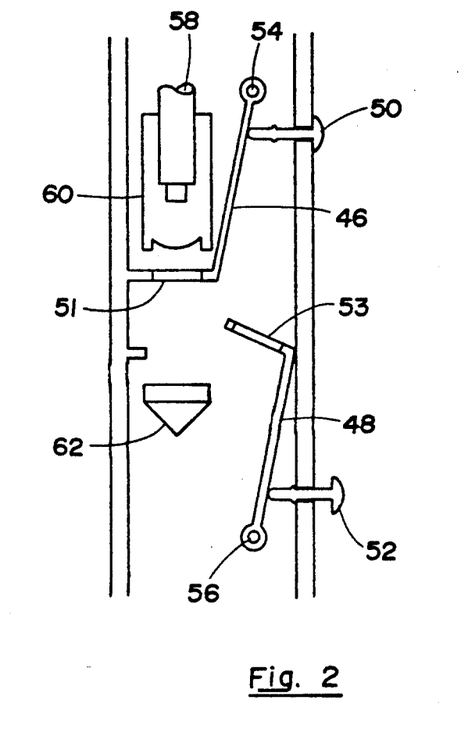
FIG. 2 is a sectional elevation view showing a single fiber system with push button activated actuators.

Referring to FIG. 2 there is shown an arrangement of push button actuators. A light fiber 58 terminates in a cylindrical ferrule with integral collimating lens 60 which directs incident light through one of two filters 51 and 53 mounted on pivotal filter levers 46 and 48, respectively, rotatable about corresponding pins 54 and 56, respectively. Levers 46 and 48 are biased upwardly so that filters 51 and 53 are out of the light transmission path. Push buttons 50 and 52 actuate levers 46 and 48, respectively. A retro-reflector 62 reflects incident light back into light fiber 58. It may be equivalent in structure to the three-sided structure obtained by severing a corner portion off of a hollow box. Alternatively, it may consist of a matrix of retroreflectors being tiny prismatic glass beads such as the product sold under the Trademark 'Scotch Lite' by 3M. If the matrix elements are less than the diameter of the fiber then a collimating lens is not required.

Figure 3:
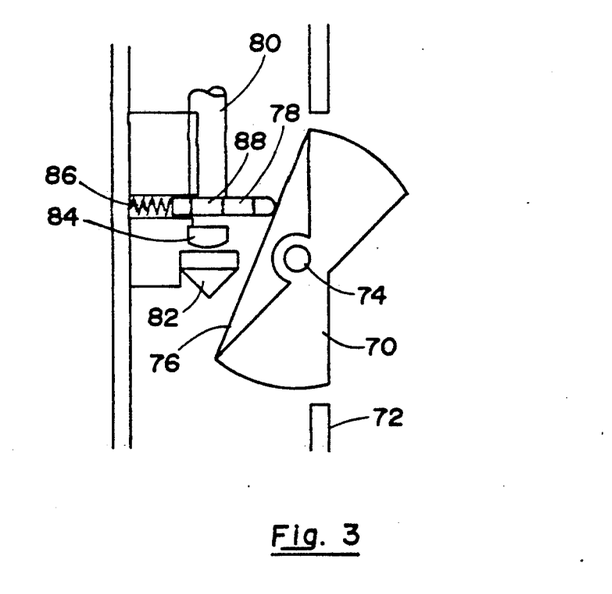
FIG. 3 is a sectional elevation view showing a single fiber optic system with a rocker actuator.

An alternative form of actuator is shown in FIG. 3 in which a rocker pivotally mounted on pin 74 which is affixed to casing 72 has filter contacting surface 76 in contact with a filter frame 78. Frame 78 is biased against surface 76 by a coil spring 86. In the position shown filter 88 is positioned in front of an end of fiber 80. A lens 84 and retro-reflector 82 are positioned on the other side of the filter 88.

Clearly, multiple filters and corresponding multiple positions of rocker 70 could be employed.

Figure 4:
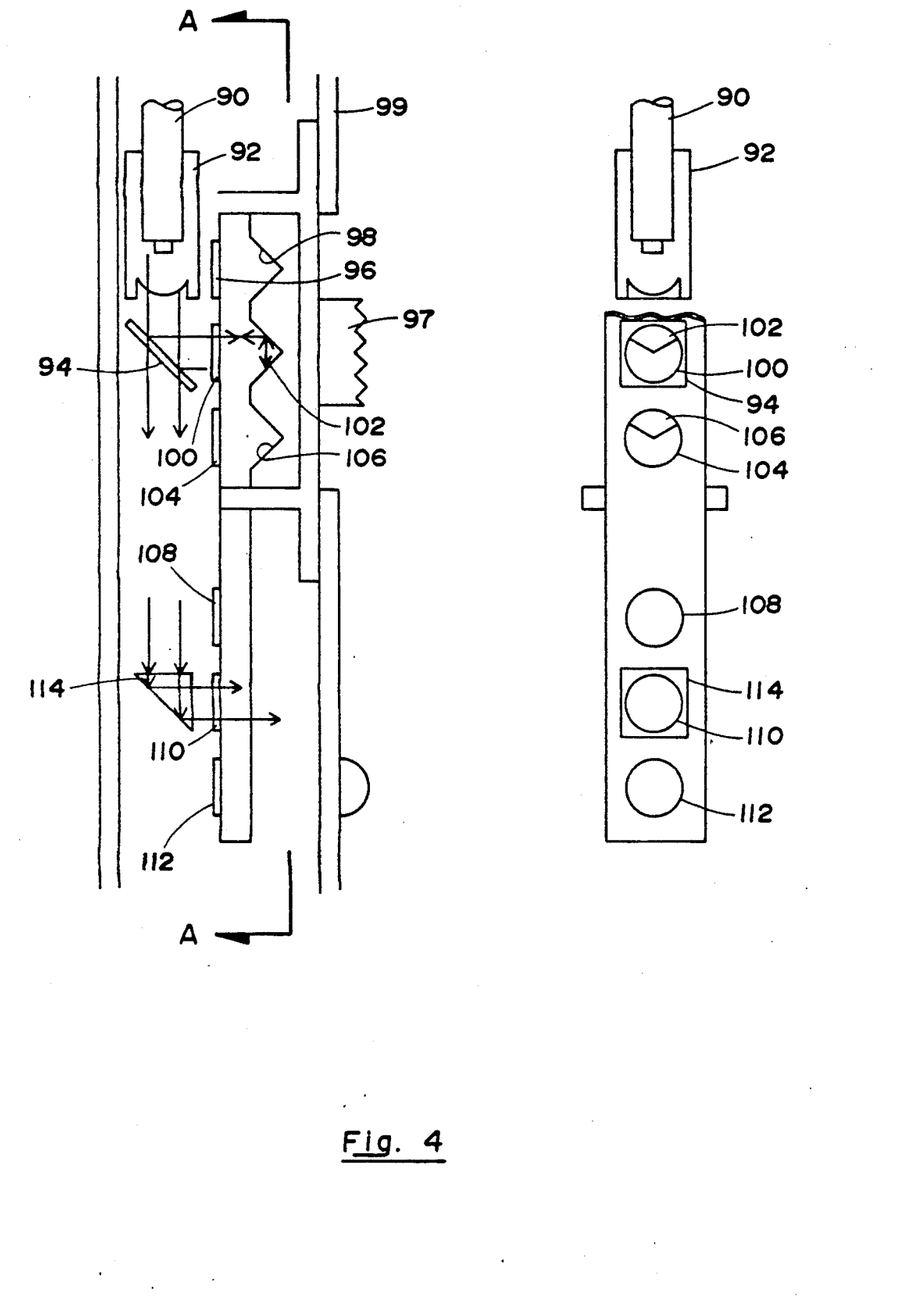
FIG. 4 is a sectional elevation view showing a slide actuator with a beam splitter to split off a portion of the incident light for use in illumination of a light guide.

Referring to FIG. 4 there is shown a moving retroreflector slide switch which includes a slide actuator 97 slidable in a casing 99 between any of three selectable positions. On the undersurface of slide 99 are three sets of retro-reflective surfaces 98, 102 and 106. There are three filters 96, 100 and 104 mounted on the underside of actuator 97 below corresponding retroreflective surfaces 98, 102 and 106, respectively. An optical fiber path means 90 terminates in a cylindrical ferrule with an integral collimating lens 92 which directs incident light onto a beam splitter 94. Beam splitter 94 is a thin acrylic slab oriented at 45 degrees to the incident light beam. Light which is reflected by beam splitter 94 passes through one of three filters 96, 102 and 106 depending on the position of slide 97. Light reflected from one of the three surface 98, 102 and 106, depending on slide position, and beam splitter 94 is directed into an end of fiber 90 by collimating lens 92.

A prism reflector 114 is positioned in line with light passing through beam splitter 94. An extension 116 of slide 97 has attached on its lower face three filters 108, 110 and 112. Prism 114 reflects light up through one of the three filters 108, 110 and 112 depending on the position of the slide 97. The light so transmitted may be used to illuminate a desired element such as position indicators.

Figure 5:
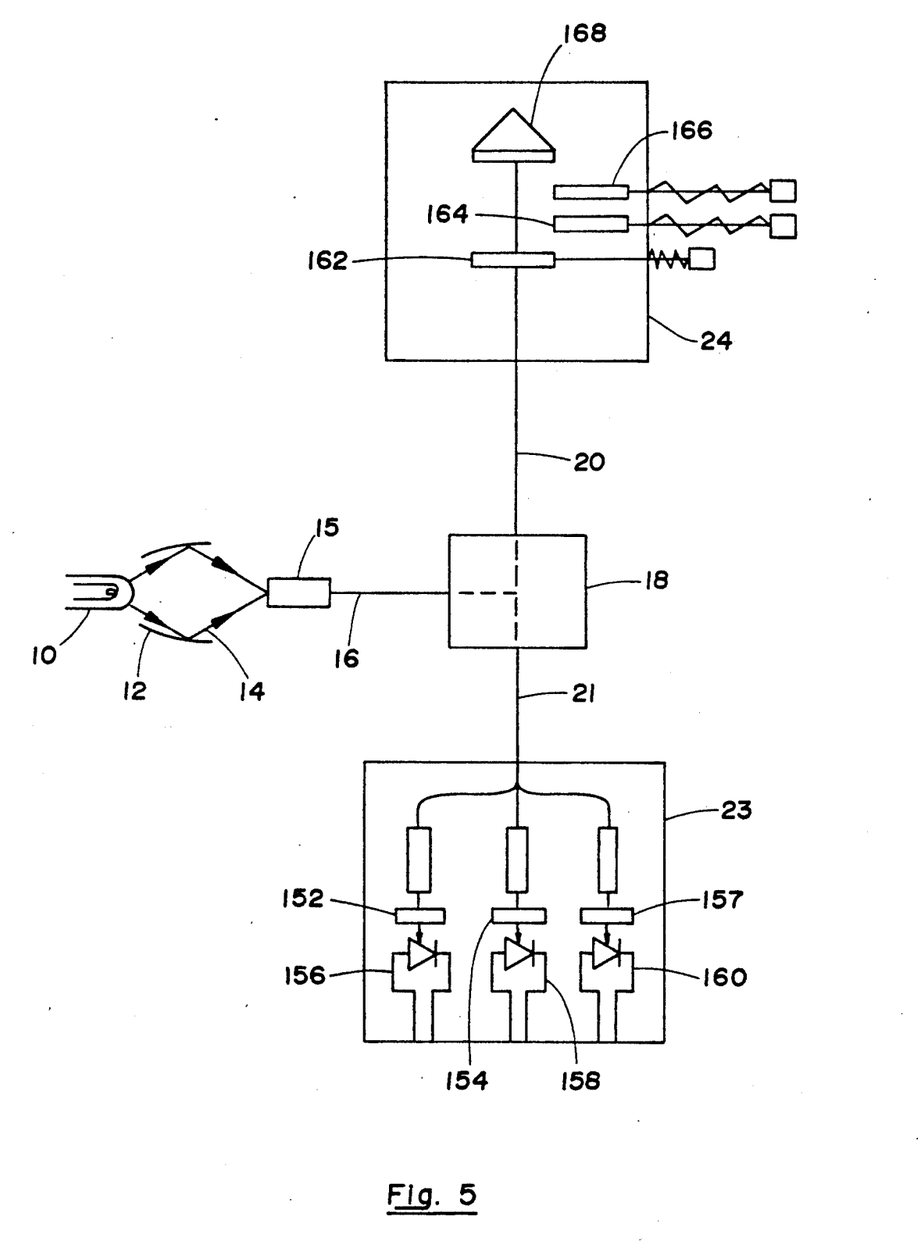
FIG. 5 is a schematic diagram of a single fiber colour multiplexing arrangement.

The arrangement of FIG. 1 can be accommodated as shown in FIG. 5 to produce colour multiplexing. Here the actuator 24 has filters of magenta 162, yellow 164 and cyan 166 which can be selectively inserted or retracted in front of a retro-reflector 168. Light returns along fiber 20 and is directed by directional coupler 18 along fiber 21 to an actuator position detector 23. Detector 23 has complementary filters of green 152, blue 154 and red 157 through which reflected light from actuator 24 passes and corresponding photo detectors 156, 158 and 160, respectively, to detect light passing through corresponding filters 152, 154 and 157.

Thus, if magenta filter 162 is in the light path of light travelling along fiber 20 and the yellow 164 and cyan 166 filters are in a retracted position, then the reflected light entering detector 23 will be absent green and no light will pass through the green filter 152 which is complementary to magenta. Thus, photodiode 156 will not receive light. Similarly, if either of blue or red filters 164 or 166 is inserted then the corresponding photodiodes 158 or 160, respectively, will also not receive light. The latter result is independent of the position of magenta filter 162. Such an arrangement provides an independent one-to-one correspondence of the outputs of each photodiodes 156, 158 and 160 with position of filters 162, 164 and 166, respectively.

Figure 6:
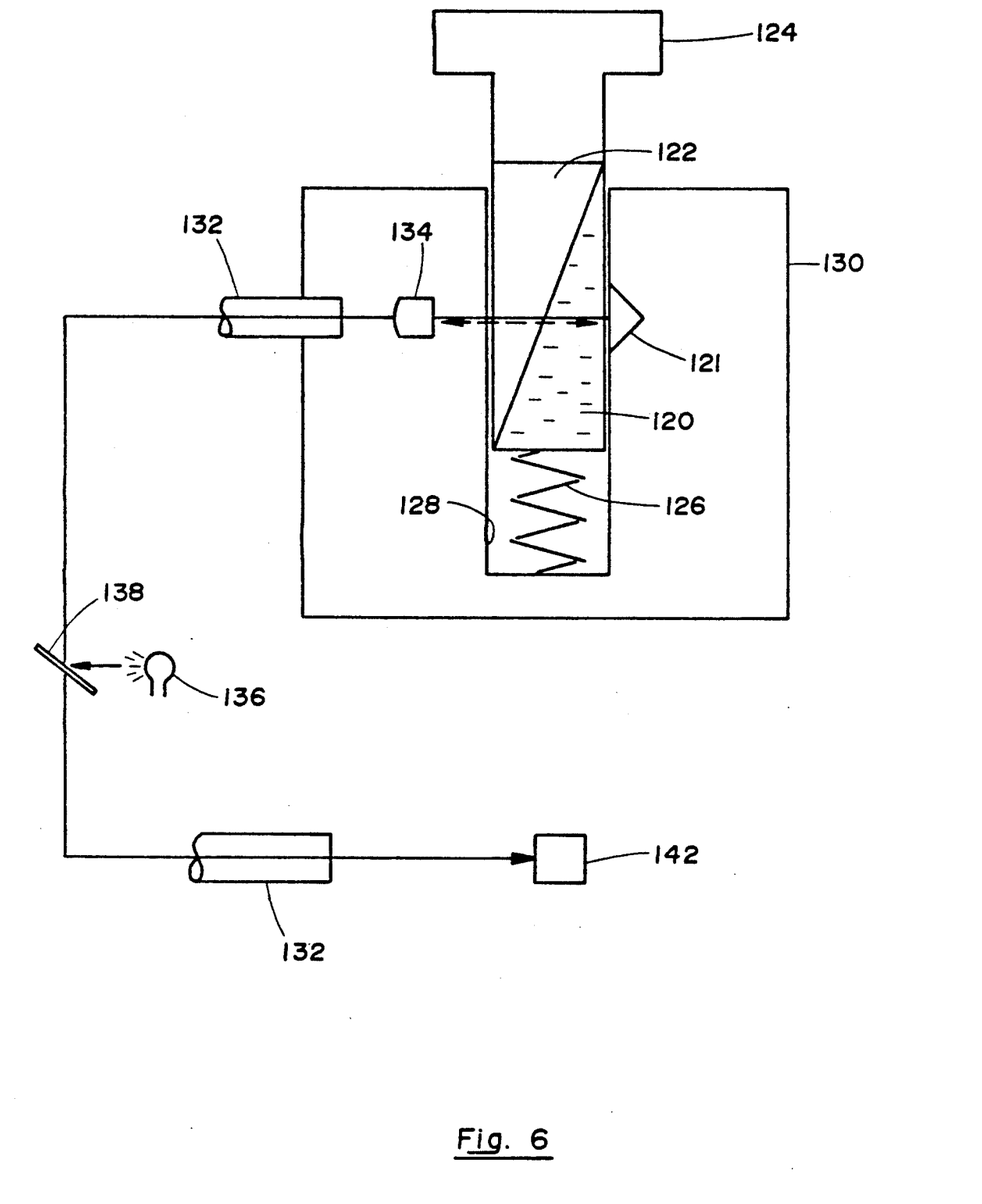
FIG. 6 is a sectional elevation view showing a continuously variable actuator having a continuously variable neutral density filter coupled to a single fiber system.

Referring to FIG. 6, there is shown a continuously variable actuator which includes a continuously variable neutral density wedge-shaped filter 120. A retro-reflector 121 is required behind the variable filter 120. Filter 120 is glued to a transparent wedge 122 which, in turn is affixed to a push button 124. Push button 124 and wedges 122 and 120 slide in a recess 128 within casing 130 and are biased out of the recess 128 by a spring 126. One end of a single fiber 132 is coupled to casing 130 and directs light through a collimating lens 134 through filter 120 and onto the retro-reflector 121. A light source 136 directs light onto a beam splitter 138 and along fiber 132, through lens 134, through filter 120, onto mirrored surface 121 and back into fiber 132 through beam splitter 138 and out fiber 132 onto a photodetector 142. Photodetector 142 provides an analog signal proportional to the switch position of push button 124.

Figure 7:
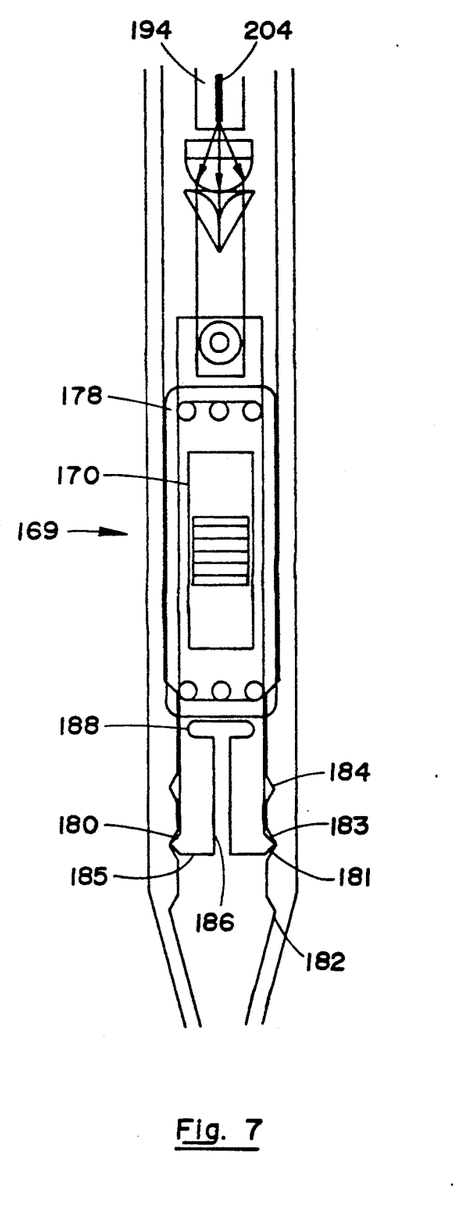
FIG. 7 is a plan view of a slide actuator with a flexible filter carrier.
Figure 8:
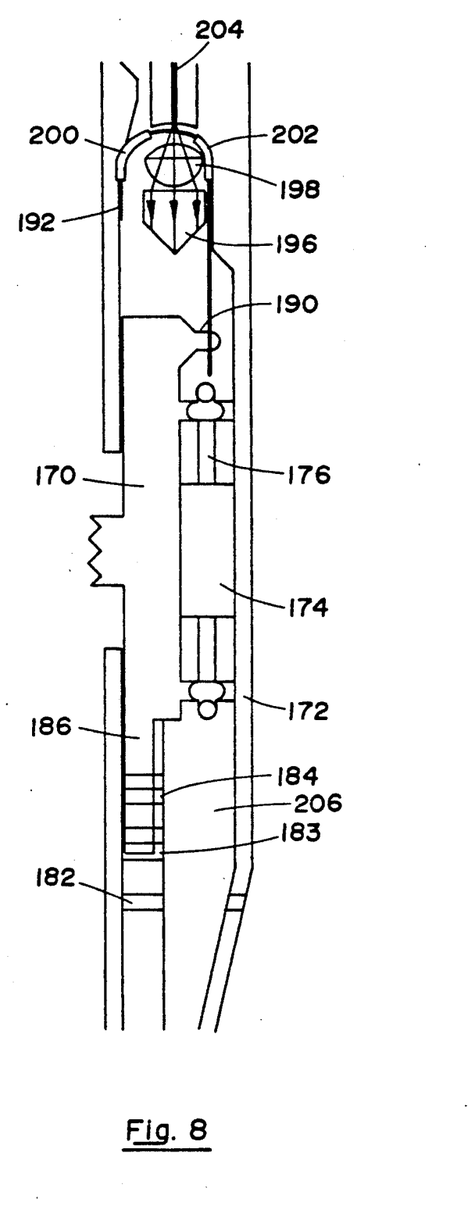
FIG. 8 is a sectional view taken along lines 7—7 of FIG. 7.

Referring to FIGS. 7 and 8 there is shown an embodiment of a slide switch 169 with a flexible filter carrier 192. A slide actuator 170 is slidable within a switch body 172 within limits determined by a body block 174 affixed to the switch body 172. An actuator extension 185 integral with actuator 170 is formed with a longitudinally extending slot 186 communicating with a transverse slot 188. Extension 185 has two detents 180 and 181 protruding from each side. Three pairs of opposed detent receptacles 182, 183 and 184 are formed in the sides of the switch body 172. Sides of the extension 185 flex towards each other until detents 180 and 181 reach one pair of the three detent receptacles 182, 183 or 184 at which point the sides of extension 185 flex outwardly causing detents 180 and 181 to engage one of the aligned pairs of detent receptacles 182, 183 or 184, thereby holding the actuator in place. An elastic band 176 fitted along an elastic band retainer 178 biases the actuator 170 towards the middle position.

A flexible transparent filter carrier 192 made of flexible acetate film is fastened to an actuator pin 190 affixed to the slide actuator 170. The filter carrier 192 is looped around an interior cavity 206 at an end of the switch body 172 opposite the detent receptacles 182, 183 and 184 and slides as the actuator 170 moves within the switch body 172. A first filter 200 and second filter 201 of different colours are fastened at spaced apart positions to the filter carrier 192.

An actuator optical fiber 204 is positioned centrally of the switch body 172 by a fiber ferrule 194. Positioned on an opposite side of the filter carrier 192 axially aligned with the fiber 204 is a collimating lens 198 followed by a retro-reflector 196.

Slide actuator 170 is movable from a neutral position as shown with detents 180 and 181 engaging detent receptacles 183 at which position light passes from actuator optical fiber 204 through the carrier 192 and is focused by collimating lens 198 so that it travels in parallel paths onto retro-reflector 196. Light reflected from the retro-reflector 196 returns and is focused back into optical fiber 204 returning back along the latter.

Moving the slide actuator 170 so that detents 180 and 181 engage with detent receptacles 182 causes the filter carrier 192 to bring the first filter 200 into the path of light emanating from optical fiber 204. Similarly, moving slide actuator 170 so that detents 180 and 181 engage with detent receptacles 184 brings the second filter 202 into the aforesaid light path.

Operationally, light in FIG. 1 from light source 10 is directed up fiber 20 to actuator 24. In actuator 24 light is filtered by one of two different filters (see FIGS. 2 and 3) depending upon the positions of actuator buttons 26 and 28 and then reflected back down fiber 20 past directional coupler 18 to directional coupler 34 and out lines 36 and 38 onto filters 43 and 44, respectively. A photodetector 142 detects the intensity of light transmitted through each filter and provides a corresponding analog signal.

With the push button actuator of FIG. 2 it is possible to have one or both filters 51 and 52 inserted simultaneously if complementary filters are used in the detectors. However, with the rocker switch of FIG. 3, only alternative positioning of the actuator is permitted. FIG. 4 is a multi-positioning switch showing three different switch positions which can not be positioned concurrently.

The use of a collimating lens as shown in the drawings focuses the reflected light onto the fiber, the combination of collimating lens and retro-reflector making the focusing insensitive to the lateral alignment of the fiber and tilt of the retro-reflector. Moreover, the fact that the reflecting element is stationary and the filters are changed substantially reduces problems due to misalignment that would arise if a reflecting element were moved to accomplish the switching.

For multiplexing as shown in FIG. 5, subtractive filters such as cyan, magenta and yellow may be used to filter out instead of pass a certain spectral band. The filters in the actuator position detectors can be either substantially the same or spectrally complementary (i.e. red, green, blue) to detect the presence or absence of a certain spectral band. With this approach many filters can be ganged in series and controlled simultaneously. This is the desired configuration in those applications where each control function is to operate simultaneously but independently of each other.

A continuously variable opacity or colour filter can be attached to a continuously adjustable actuator as in FIG. 6, for analog control applications. A continuously variable light level will be produced that will generate an analog control voltage. A reference signal obtained via a secondary reference fiber may be required to supply a compensation signal used to track fluctuations in the source brightness and optical system efficiency.

The slide actuator with flexible filter carrier of FIGS. 7 and 8 can obviously operate with one, two or more filters attached at spaced apart locations on the carrier and the switch body having as many sets of detent receptacles as are required. The single flexible carrier is a very simple, easy to assemble and inexpensive structure.

Accordingly, while this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

We claim:

1. A fiber optic switch comprising:
    an actuator reversibly movable between at least two switch positions;
    an actuator position detector;
    optical fiber path means connected between the actuator and the actuator position detector;
    means for coupling light from a light source into said fiber path means so a to travel towards said actuator;
    a filter coupled to said actuator selectably insertable into a light path of light emanating from an end of said fiber at said actuator;
    a retro-reflector positioned at said actuator to reflect light from said optical fiber path means 180 degrees so as to travel back along the optical fiber path means towards said actuator position detector; and
    means for directing reflected light returning down said optical fiber path means from said actuator toward said actuator position detector.

2. A switch according to claim 1, including a collimating lens located at an end of said optical fiber path means at said actuator in front of said retro-reflector.

3. A switch according to claim 1 or 2, wherein said light coupling and directing means is a beam splitter.

4. A switch according to claim 1 or 2, wherein said actuator position detector includes a filter positioned in the path of light emanating from a detector end of said optical fiber path means with a selected light response relative to that of said actuator filter.

5. A switch according to claim 1, including two filters of different colours coupled to said actuator so that one is positioned to filter light from an actuator end of said optical fiber path means when said actuator is in a first switch position and another to filter the light when said actuator is in a second position.

6. A switch according to claim 5, including means for directing light from a detector end of said optical fiber path means into two detector filters of selected colours relative to respective ones of said actuator filters each for filtering light from a respective end of said detector fibers.

7. A switch according to claim 6, including a pair of photodetectors positioned near said detector filters so as to detect the intensity of light transmitted therethrough.

8. A switch according to claim 5, wherein said optical fiber path means includes a single actuator optical fiber between said actuator and light directing means and a single detector optical fiber between said light directing means and said actuator position detector.

9. A switch according to claim 8, wherein said light directing means includes two detector input fibers coupled to an end of said detector optical fiber proximate said detector and a pair of photodetectors positioned near said filters so as to detect the intensity of light transmitted therethrough.

10. A switch according to claim 1 or 2, wherein said actuator includes lever means and said filter is coupled to said lever means, said lever means pivotal from a first position in which said filter is in the light transmission path of light from said optical fiber path means to a second position away from said light transmission path, and biasing means for biasing said lever means toward said second position.

11. A switch according to claim 1 or 2, wherein said actuator includes slide means and said filter is coupled to said slide means, said slide means slidable from a first position in which said filter is in the light transmission path of light from said optical fiber path means to a second position away from said light transmission path.

12. A switch according to claim 1 or 2, including first and second actuator filters of different colours coupled to said actuator and independently insertable in and retractable from a light path of light from said optical fiber path means into said actuator, first and second filters in said actuator position detector of colours spectrally complementary to those of respective first and second actuator filters and first and second photodetectors positioned to receive and detect light passing through respective first and second actuator position detector filters.

13. A switch according to claim 1 or 2, including a flexible filter carrier affixed to said actuator and slidable so as to intercept light from said optical fiber path means intermediate an end of said fiber and said retro-reflector wherein said filter carrier is transparent at carrier positions corresponding to said two switch positions and said filter is affixed to said carrier at one of said two carrier positions so as to filter light travelling along said optical fiber path means when said switch is in a position corresponding to said one carrier position.

14. A switch according to claim 13, including a third switch position, a second filter of a colour different from said filter and wherein said filter carrier is transparent at a carrier position corresponding to said third switch position and said second filter is affixed to said filter carrier at said carrier position.

15. A fiber optic switch comprising:
an actuator reversibly movable among a plurality of switch positions;
an actuator position detector;
optical fiber path means connected between the actuator and the actuator position detector;
means for coupling light from a light source into said optical fiber path means so as to travel towards said actuator;
a plurality of filters coupled to said actuator and selectably insertable into a path of light emanating from an end of said optical fiber path means at said actuator;
a retro-reflector positioned at said actuator to reflect light from said optical fiber path means 180 degrees so as to travel back along said optical fiber path means towards said actuator position detector;
means for directing reflected light returning down said optical fiber path means from said actuator toward said actuator position detector 16. A switch according to claim 15, including a collimating lens located at an end of said fiber proximate said actuator.

17. A switch according to claim 16, wherein said optical fiber path means includes a single actuator optical fiber between said actuator and said light directing means and a single detector optical fiber between said directing means and said actuator position detector.

18. A switch according to claim 17, wherein said coupling means and said directing means includes a light source fiber having one end proximate the light source and another end proximate a beam splitter for directing light from the light source travelling along a light source fiber into said actuator optical fiber towards said actuator and for directing light returning from said actuator along said actuator optical fiber into said detector optical fiber 19. A switch according to claim 17, wherein said actuator position detector includes means for directing light returning from said actuator to a plurality of fibers, each filter of said plurality of filters in said detector corresponding to a respective one of said filters in said actuator and having substantially the same colour as the latter and a plurality of photodetectors corresponding to respective filters for detecting the transmission of light through a corresponding filter 20. A switch according to claim 17, wherein said actuator includes a slide reversibly movable from a first position in which only a first one of said filters is in the light path to a second position in which only a second one of said filters is in the light path and said retro-reflector positioned so as to reflect light back into said actuator optical fiber after passing through a selected one of said filters.

21. A switch according to claim 17, wherein said actuator includes a pair of levers each having an associated filter coupled thereto and reversibly movable from a first position in which the associated filter is in the light path to a second position in which the associated filter is away from the light path.

22. A switch according to claim 17, wherein said actuator is reversibly rotatable from a first position in which only a first one of said filters is in the light path to a second position in which only a second one of said filters is in the light path and said retro-reflector positioned so as to reflect light back into said actuator optical fiber after passing through a selected one of said filters.

23. A switch according to claim 20, 21 or 22, including a pair of auxiliary filters each coupled to a corresponding one of said filters so as to be movably therewith and means for transmitting a portion of light to said auxiliary filter corresponding in colour to he filter in the light path, indicator means responsive to light received from said auxiliary filters to illuminate and indicate switch position.

24. A switch according to claim 15, 16 or 17 wherein said actuator filters are each of different colours and are each independently insertable and retractable from the light path, a plurality of filters in said actuator position detector each for a colour complementary to the colour of a corresponding one of said actuator filters and a plurality of photodetectors positioned to detect light transmitted through respective ones of said detector filters.

25. A switch according to claim 15, including a flexible filter carrier affixed to said actuator and slidable through a path of light from said optical fiber path means wherein said filter carrier is transparent at carrier positions corresponding to said two switch positions and said filter is affixed to said carrier at one of said two carrier positions so as to filter light emanating from said optical fiber path means.

26. A switch according to claim 15, including a flexible filter carrier affixed to said actuator and slidable through a path of light from said optical fiber path means wherein said filter carrier is transparent at carrier positions corresponding to said two switch positions and one or more additional switch positions and a plurality of filters are affixed to said carrier at positions corresponding to selected ones of said switch positions so as to be alternately positionable to filter light from said optical fiber path means.

27. In a fiber optic assembly, a combination including a light source, a single optical fiber path means, light coupling means for coupling the light into said fiber path, a collimating lens mounted at an end of said fiber path means, means for modifying the light so as to make it discernable from the unmodified light, a retroreflector mounted after said modifying means so as to reflect back into said fiber path means light emanating therefrom, and means for detecting the modified light.

28. A fiber optic switch, comprising: a filter, an actuator causing, fiber coupling means for coupling an end of an optical fiber to said casing, an actuator reversibly movable in said casing between a pair of switch positions for selectably locating said filter in or out of a path of light emanating from an end of said optical fiber, an actuator position detector, and a retro-reflector positioned in said casing to reflect light from the fiber 180 degrees so as to travel back along said fiber towards said actuator position detector.

29. A fiber optical switch, comprising a continuously variable reversibly movable actuator, an actuator position detector, an optical fiber path means connected between the actuator and the actuator position detector, means for coupling light from a light source into the fiber so as to travel towards the actuator, a continuously variable neutral density filter coupled to the actuator and continuously variably insertable in the path of light emanating from an end of the fiber path means so as to continuously variably attenuate light transmitted therethrough, a retro-reflector positioned at the actuator to reflect light from the fiber 180 degrees so as to travel back along the same fiber path means towards the actuator position detector, means for directing reflected light returning down the fiber path means from the actuator toward the actuator position detector, and a light detector at an end of said fiber path means to detect reflected light and provide a corresponding analog signal.

30. A switch according to claims 27, 28 or 29, wherein said optical fiber path means includes an actuator optical fiber between said actuator an said light coupling means and detector optical fiber between said light coupling means and said actuator position detector.

* * * * *